United States Patent [19]

Yamane et al.

[11] Patent Number: 4,924,277
[45] Date of Patent: May 8, 1990

[54] MIS TRANSISTOR DEVICE

[75] Inventors: Hiroyuki Yamane, Nagoya; Yasushi Higuchi, Kariya; Tetsuo Fujii, Toyohashi, all of Japan

[73] Assignee: Nippondenso Co., Ltd., Kariya, Japan

[21] Appl. No.: 342,608

[22] Filed: Apr. 20, 1989

Related U.S. Application Data

[63] Continuation of Ser. No. 26,998, Mar. 17, 1987, abandoned.

[30] Foreign Application Priority Data

Mar. 18, 1986 [JP] Japan .................................. 61-60378

[51] Int. Cl.$^5$ ............................................ H01L 29/78
[52] U.S. Cl. .................................. 357/23.3; 357/23.4; 357/42; 357/239; 357/23.11
[58] Field of Search ..................... 357/23.3, 23.4, 42, 357/23.9, 23.11

[56] References Cited

U.S. PATENT DOCUMENTS

| | | | |
|---|---|---|---|
| 4,577,391 | 3/1986 | Hsia et al. | 357/23.9 |
| 4,597,824 | 7/1986 | Shinada et al. | 357/23.4 |
| 4,599,789 | 7/1986 | Gasner | 357/42 |

FOREIGN PATENT DOCUMENTS

| | | | |
|---|---|---|---|
| 52-22480 | 2/1977 | Japan | 357/23.4 |
| 53-122372 | 10/1978 | Japan | 357/23.3 |
| 59-195869 | 11/1984 | Japan | 357/23.3 |

OTHER PUBLICATIONS

IEEE Transaction of Electron Devices, pp. 782–785 IEEM 1984 by K. Balasubramanyam et al.
IEEE Transactions on Electron Devices–vol. Ed–29 No. 4 pp. 611–618 Apr. 1982.
IEEE Transaction on Electron Devices pp. 242–245 IEDM 1985.
IEEE Transaction on Electron Devices vol. Ed–29 No. 4, Apr. 1982 pp. 590–596.

Primary Examiner—Andrew J. James
Assistant Examiner—David Soltz
Attorney, Agent, or Firm—Cushman, Darby & Cushman

[57] ABSTRACT

In a MIS transistor device, a gate electrode is formed on a first conductivity-type well region formed in a semiconductor substrate. By implanting impurities with the gate electrode and an element-isolating region made up of a field insulating film as a mask, an N-type diffusion layer having a higher impurity concentration than the first conductivity-type well region is formed on the sides of the gate electrode. A second conductivity-type diffusion layer of a first impurity concentration higher than the N-type diffusion layer is formed with a smaller width than the N-type diffusion layer in the N-type diffusion layer formed on one side of the gate electrode. A second conductivity-type diffusion layer of a second high concentration is formed with a smaller width than the N-type diffusion layer in the N-type diffusion layer formed on the other side of the gate electrode.

4 Claims, 3 Drawing Sheets

FIG. I

MIS TRANSISTOR DEVICE

This is a continuation of Application No. 026,998, filed Mar. 17, 1987, now abandoned, which was abandoned upon the filing hereof.

BACKGROUND OF THE INVENTION

The present invention relates to a semiconductor device, or more in particular to a MIS (metal insulator semiconductor) transistor which makes possible the reduction in size of a complementary-type circuit or the like having double functions of P-type and N-type channel MIS transistors such as CMOS.

With the advance in size reduction of MIS transistor, there has been a corresponding increasing demand for consideration of the short-channel effect or the hot carrier effect. The short-channel effect is defined as a phenomenon especially related to a P-type channel MIS transistor in which the increased proximity between the source and drain with size reduction of the device causes the potential of the channel to be affected by the drain voltage reducing the threshold voltage or punch-through voltage. The hot carrier effect, on the other hand, is a phenomenon specially related to an N-type channel MIS transistor in which electrons flowing in the channel are implanted toward the gate by scattering, and electrons and holes generated by a weak breakdown are also implanted. This last-mentioned phenomenon is likely to occur more, the higher the drain voltage, and the maximum voltage applicable for long time to a submicron device is determined by the hot-carrier breakdown voltage.

In the prior art, a lightly doped drain (hereinafter referred to as "LDD") as shown in FIG. 6 has been used for the hot carrier effect. In FIG. 6, a gate electrode 6 is formed in the surface of a P-type well region 2b formed in a semiconductor substrate 1 through a gate insulating film 5, and a field insulating film 7 in an element isolation region. After that, ions are implanted with the gate electrode 6 and the field insulating film 7 masked thereby to form an N⁻-type diffusion layer 8 of low impurity concentration. Spacers 9 are provided on both sides (side walls) of the gate electrode 6, and ions are implanted with the gate electrode 6, spacer 9 and the field insulating film 7 masked thereby to form an N+-type diffusion layer 10 of high impurity concentration and with the bottom thereof diffused deeper than the bottom of the N⁻-type diffusion layer 8.

SUMMARY OF THE INVENTION

In the above-mentioned LDD structure, the hot carrier effect on the N-type channel MIS transistor is reduced. Nevertheless, it is necessary to provide the spacer 9 in order to form the N+-type diffusion layer 10. The forming of the spacer 9 involves a difficult control technique and an increased number of manufacturing processes. Further, when this structure is used for a complementary circuit doubling as P- and N-type channel MIS transistors such as CMOS, another consideration is required to reduce the short channel effect on the P-type channel MIS transistor. In the prior art, the P-type channel MIS transistor is designed in a comparatively large size for lack of other proper methods.

The object of the present invention, which has been developed in view of the aforementioned fact, is to provide a structure of MIS transistor for a complememtary-type circuit having double functions of P- and N-type channel MIS transistors such as CMOS, in which both the short channel effect and the hot carrier effect are reduced at the same time without forming any spacer or the like simply by adding to one manufacturing process.

According to the present invention, there is provided a MIS transistor comprising a first conductivity-type well region formed in a semiconductor substrate, a gate electrode formed on the first conductivity-type well region through an insulating film, an N-type diffusion layer formed by implanting impurities by the ion implant method or the like on both sides of the gate electrode with the gate electrode and the insulating film making up an element isolation region as a mask, the N-type diffusion layer having a higher concentration of impurities than the first conductivity-type well region, a second conductivity-type diffusion layer of the first high concentration having a higher concentration of impurities and formed with a smaller width than the N-type diffusion layer in the latter layer formed on one side of the gate electrode, the second conductivity-type diffusion layer being electrically connected to the source electrode, and a second conductivity-type diffusion layer of the second high concentration formed in the N-type diffusion layer with a smaller width than the latter layer formed on the other side of the gate electrode and electrically connected to the drain electrode.

In the construction according to the invention described above, the fact that the N-type diffusion layer is formed on a part of the channel region of the MIS transistor increases the concentration of the channel region proximate to the edge of the high-concentration second conductivity-type diffusion layer of a P-type channel MIS transistor, thereby increasing the absolute value of the threshold voltage. Also, the expansion of the depletion region near the drain is reduced. Further, since the impurity concentration of the N-type diffusion layer is higher than that of the first conductivity-type well region, the junction depth is effectively reduced as compared with the case lacking an N-type diffusion layer, resulting in a longer effective gate length. In the N-type channel MIS transistor, on the other hand, the impurity concentration of the N-type diffusion layer is lower than that of the high-concentration second conductivity-type diffusion layer, and therefore the impurity distribution is gentler thus relaxing the field concentration at the drain.

The MIS transistor according to the present invention has the advantage that in a complementary-type circuit or the like having double functions of P- and N-type channel MIS transistors, the spacer or the like is eliminated by adding a single process of forming an N-type diffusion layer in the P-MIS and N-MIS source-drain regions simultaneously, thereby reducing both the short channel effect for P-MIS and the hot carrier effect for N-MIS which poses a great problem hampering the size reduction of devices.

DESCRIPTION OF THE PREFERRED EMBODIMENTS

Figure 1:
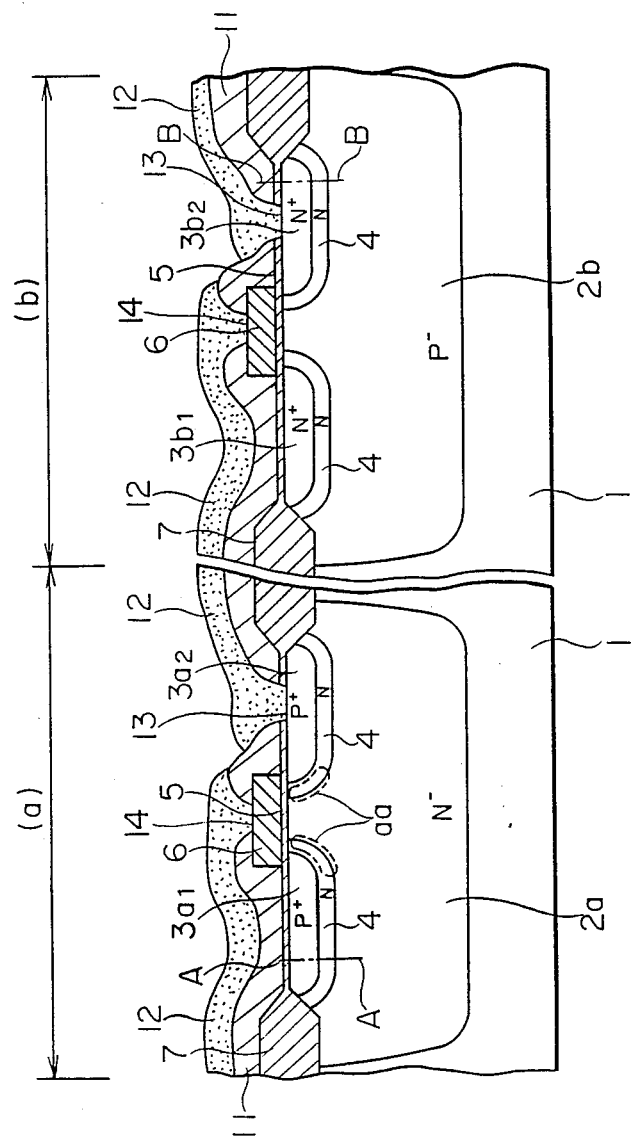
FIG. 1 is a sectional view of a MIS transistor according to an embodiment of the present invention.

The present invention will be explained in detail below with reference to an embodiment shown in the drawing. FIG. 1 is a sectional view of a MIS transistor according to an embodiment of the present invention. In FIG. 1, a P-type channel MIS transistor (a) (hereinafter referred to as "P-MIS") and an N-type channel MIS transistor (b) (hereinafter referred to as "N-MIS") are shown which are applicable to a complementary type circuit such as CMOS. In FIG. 1, the P-MIS in a semiconductor substrate 1 of Si or the like has formed therein an $N^-$-type well region 2a diffused deep with N-type impurities such as phosphor, and the N-MIS is formed with a $P^-$-type well region 2b diffused deep with P impurities such as boron. The main surfaces of the semiconductor substrate 1 of the P-MIS and N-MIS are partially formed with a gate electrode 6 including a conductive layer of polycrystal Si, Ti or Mo through a gate insulating film 5 made up of an Si oxidated film or Si nitrized film or the combination thereof. The surface of the semiconductor substrate 1 isolating the MIS transistors, on the other hand, has formed therein a field insulating film 7 making up an element-isolating region made of an Si oxidated film or the like. An element-isolating region may be formed alternatively by etching the surface of the semiconductor substrate 1 to form a slot, followed by embedding an Si oxidated film, polycrystal Si or the like therein. The field insulating film according to the present invention also includes such an element-isolating region.

According to the present embodiment, the P-MIS and N-MIS are subjected simultaneously to ion implantation of N-type impurities of phosphor or the like with the gate electrode 6 and the field insulating film 7 as a mask with a concentration $C_N$ three times to thirty times higher than the impurity concentrations $C_{N^-}$ and $C_{F^-}$ of the $N^-$-type well region 2a and the $P^-$-type well region 2b respectively. If required, an appropriate heat treatment is effected after ion implant to form the N-type diffusion layer 4 in the P-MIS and N-MIS.

Subsequently, in the CMOS fabrication process, the P-MIS is subjected to ion implant of P-type impurities such as boron with the gate electrode 6 and the field insulating film 7 as a mask in the same manner as the N-type diffusion layer 4. A first $P^+$-type diffusion layer $3a_1$ electrically connected to the source electrode and a second $P^+$-type diffusion layer $3a_2$ electrically connected to the drain electrode are respectively formed in the N-type diffusion layer 4 on the sides of the gate electrode 6. The N-MIS, on the other hand, is implanted with ions of N-type impurities such as phosphor or arsenic thereby to form a first $N^+$-type diffusion layer $3b_1$ electrically connected to the source electrode and a second $N^+$-type diffusion layer $3b_2$ electrically connected to the drain electrode respectively in the N-type diffusion layer 4 on the sides of the gate electrode 6. The impurity concentration of the $P^+$-type diffusion layer 3a and the $N^+$-type diffusion layer 3b is higher than that of the N-type diffusion layer 4. Both of the former diffusion layers are diffused shallower than the N-type diffusion layer 4, with the result that they are formed with a smaller width than the N-type diffusion layer 4. Further, the $P^+$-type diffusion layer 3a, $N^+$-type diffusion layer 3b and the N-type diffusion layer 4 may be alternatively formed in the order of steps reverse to the one mentioned above. The interlayer insulating film 7 has also a $CVD-SiO_2$ film 11 formed thereon and has an aluminum wiring 12 laid out on the film 11. The aluminum wiring is electrically connected through an ohmic contact hole 13, 14 respectively, to the gate electrode 6 or to the $P^+$-type diffusion layer or the $N^+$-type diffusion layer respectively.

The aforementioned construction is understood to improve the characteristics of the MIS transistor.

Figure 2:
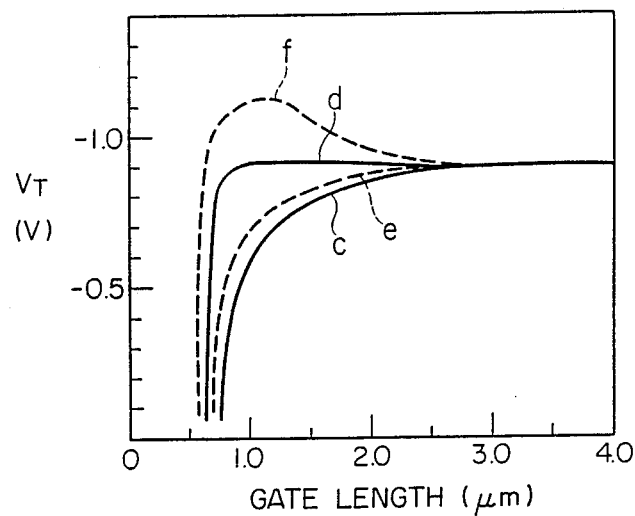
FIG. 2 is a diagram showing the relationship between the gate length and the threshold voltage $V_T$.

In the P-MIS, the N-type diffusion layer 4 causes a high impurity concentration of the channel region aa near the edge of the $P^+$-type diffusion layer 3a. This acts to increase the absolute value $|V_T|$ of the threshold voltage $V_T$ of the MIS transistor. This function works shorter the gate length of the device. With the decrease in the gate length due to the short channel effect, on the other hand, the absolute value $|V_T|$ decreases. Both are balanced to keep the absolute value $|V_T|$ substantially constant regardless of the gate length, thus reducing the short channel effect. This manner will be explained with reference to FIG. 2 showing the relationship between the gate length and the threshold voltage $V_T$. In FIG. 2, the solid line c represents the characteristic in the absence of the N-type diffusion layer 4, and the solid line d the characteristic of the embodiment under consideration. According to the present embodiment, the threshold voltage $V_T$ is substantially constant at a gate length of about 0.8 μm or more, indicating that the embodiment is effectively applicable to a MIS transistor with short gate, that is, a MIS transistor smaller in size. The effect of the present is obtained to some extent as long as the impurity concentration $C_N$ of the N-type diffusion layer 4 is higher than the impurity concentration $C_{N^-}$ of the $N^-$-type well region 2a. The effect of the invention becomes more conspicuous to the extent that the impurity concentration $C_N$ is three to 30 times higher than the concentration $C_{N^-}$. If the former is 15 to 20 times higher than the latter, on the other hand, a superior characteristic is obtained. The solid line in FIG. 2 represents the characteristic associated with the last-mentioned case. The dotted lines e and f indicate the characteristics associated with the case where the impurity concentration $C_N$ is less than three times higher and more than 30 times higher than the impurity concentration $C_{N^-}$ respectively.

Figure 3:
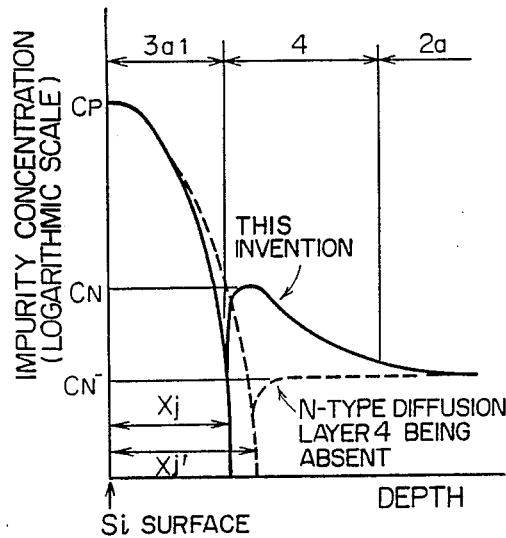
FIG. 3 shows an impurity concentration distribution in the section along A—A of FIG. 1.

FIG. 3 shows a distribution of impurity concentrations in the sectional view along the line A—A of FIG. 1. As shown, the presence of the N-type diffusion layer 4 substantially causes a smaller junction depth Xj than the junction depth Xj' in the absence thereof. As a result, the effective channel length is lengthened substantially thereby to reduce the short channel effect. Another effect of the embodiment is that the depletion layer created between the N-type diffusion layer 4 and the $P^+$-type diffusion layer 3a is prevented from expanding due to a comparatively high concentration of the N-type diffusion layer 4. Furthermore, the punch-through breakdown voltage is improved.

Figure 4:
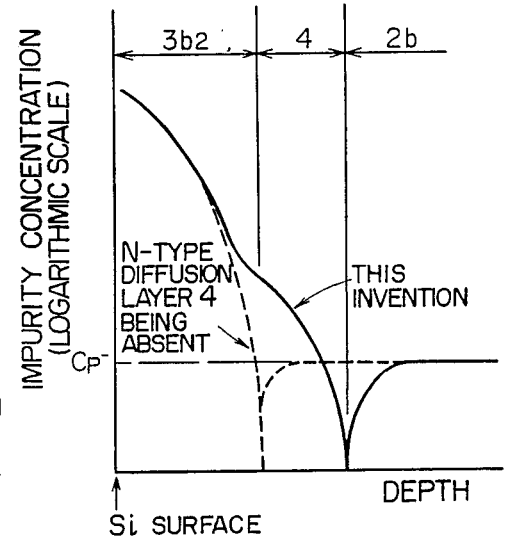
FIG. 4 shows an impurity concentration distribution in the sectional along B—B of FIG. 1.

Now, referring to the N-MIS, the distribution of impurity concentration in the sectional view along line B—B of FIG. 1 is shown in FIG. 4. In the case of N-MIS where the N-type diffusion layer 4 is formed between the $N^+$-type diffusion layer 3b and the $p^-$-type well region 2b, the distribution of impurity concentrations at the drain is gentler than in the absence of the N-type diffusion layer 4. As a consequence, the field concentration at the drain is relaxed, thus reducing the hot carrier effect. The increase in hot carries which occurs for the P-MIS, incidentally, does not pose any problem at all since the hot carriers generated in the P-MIS is fewer by several orders of digits than those of the N-MIS.

Figure 5:
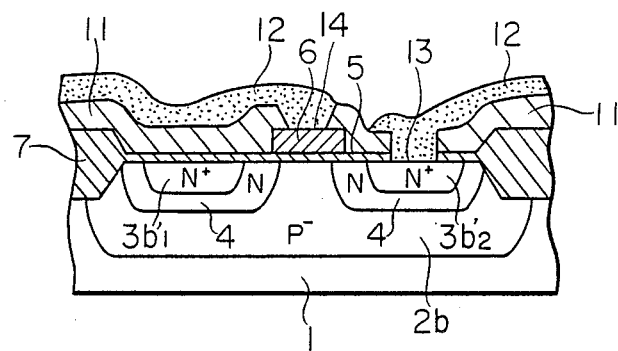
FIG. 5 is a sectional view of a MIS transistor according to another embodiment of the present invention.
Figure 6:
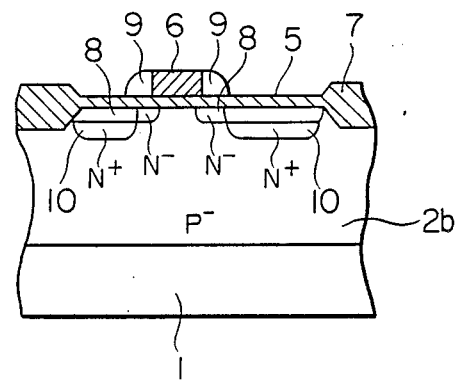
FIG. 6 is a sectional view showing a conventional LDD structure.

FIG. 5 is a sectional view showing another embodiment of the present invention. In FIG. 5 including an N-MIS of higher breakdown voltage, N-MIS and P-MIS of lower breakdown voltage similar to those included in the aforementioned embodiment may be used. They are formed simultaneously with the N-MIS of the present embodiment. In FIG. 5, the component parts up to the N-type diffusion layer 4 are the same as in the aforementioned embodiment, and are designated by like reference numerals. According to the embodiment under consideration, the side of the gate electrode 6 on the drain region or the source and drain regions (the latter shown in FIG. 5) is covered by a photo-resist or the like, and then ions of N-type impurities like arsenic are implanted under the same conditions as in the aforementioned embodiment thereby to form the first N+-type diffusion layer $3b_1$ and the second N+-type diffusion layer $3b_2$. According to this embodiment, the N-type diffusion layer 4 in the channel region is widened, and therefore an N-MIS of high breakdown voltage is provided. As in FIG. 1, the interlayer insulating film 7 has further a CVD-SiO$_2$ film 11 formed thereon, and has an aluminum wiring 12 laid out on the film 11. The aluminum wiring 12 is electrically connected to the N+-type diffusion layer $3b_2$ or the gate electrode through the ohmic contact hole 13, 14.

We claim:

1. A CMOS transistor device comprising:
   a semiconductor substrate;
   an N$^-$ type and a P$^-$ type well region formed in said semiconductor substrate;
   an insulating film formed on said N$^-$ type and said P$^-$ type well regions;
   a first and a second gate electrode formed on said insulating film respectively over said N$^-$ type and said P$^-$ type well regions;
   a first pair of N type diffusion layers formed in said N$^-$ type well region and separated by a portion underlying said first gate electrode, said first pair of N type diffusion layers having an impurity concentration of 3 to 30 times higher than an impurity concentration of said N$^-$ type well region;
   a second pair of N type diffusion layers formed in said P$^-$ type well region and separated by a portion underlying said second gate electrode, said second pair of N type diffusion layers having an impurity concentration of 3 to 30 times higher than an impurity concentration of said P$^-$ type well region;
   a first and a second P+ type diffusion layer formed respectively in said first pair of N type diffusion layers formed in said N$^-$ type well region, and having widths respectively narrower than widths of said first pair of N type diffusion layers, said first and said second P+ type diffusion layers having an impurity concentration higher than the impurity concentration of said first pair of N type diffusion layers;
   a first and a second N+ type diffusion layer formed respectively in said second pair of N type diffusion layers formed in said P$^-$ type well region, and having widths respectively narrower than widths of said second pair of N type diffusion layers, said first and second N+ type diffusion layers having an impurity concentration higher than the impurity concentration of said second pair of N type diffusion layers;
   a first and a second drain electrode respectively electrically connected to said first P+ type diffusion layer and said first N+ type diffusion layer; and
   a first and a second source electrode respectively electrically connected to said second P+-type diffusion layer and said second N+-type diffusion layer.

2. A CMOS transistor device according to claim 1, wherein said first and said second P+ type diffusion layer respectively extend in regions of said first pair of N type diffusion layers which are located under said first gate electrode, and said first and said second N+ type diffusion layers respectively extend in regions of said second pair of N type diffusion layers which are located under said second gate electrode.

3. A CMOS transistor device comprising:
   a semiconductor substrate;
   an N$^-$ type and a P$^-$ type well region formed in said semiconductor substrate;
   an insulating film formed on said N$^-$ type and said P$^-$ type well region;
   a first and a second gate electrode formed on said insulating film respectively over said N$^-$ type and said P$^-$ type well region;
   a first pair of N type diffusion layers formed in said N$^-$ type well region and separated by a portion underlying said first gate electrode, said first pair of N type diffusion layers having an impurity concentration 15 to 20 times higher than an impurity concentration of said N$^-$ type well region;
   a second pair of N type diffusion layers formed in said P$^-$ type well region and separated by a portion underlying said second gate electrode, said second pair of N type diffusion layers having an impurity concentration 15 to 20 times higher than an impurity concentration of said P$^-$ type well region;
   a first and a second P+ type diffusion layer formed respectively in said first pair of N type diffusion layers formed in said N$^-$ type well region, and having widths respectively narrower than widths of said first pair of N type diffusion layers, said first and said second P+ type diffusion layer having an impurity concentration higher than the impurity concentration of said first pair of N type diffusion layers;
   a first and a second N+ type diffusion layer formed respectively in said second pair of N type diffusion layers formed in said P$^-$ type well region, and having widths respectively narrower than widths of said second pair of N type diffusion layers, said first and said second N+ type diffusion layer having an impurity concentration higher than the impurity concentration of said second pair of N type diffusion layers;
   a first and a second drain electrode respectively electrically connected to said first P+ type diffusion layer and said first N+ type diffusion layer; and
   a first and a second source electrode respectively electrically connected to said second P+type diffusion layer and said second N+-type diffusion layer.

4. A CMOS transistor device according to claim 3, wherein said first and said second P+ type diffusion layer respectively extend in regions of said first pair of N type diffusion layers which are located under said first gate electrode, and said first and said second N+ type diffusion layers respectively extend in regions of said second pair of N type diffusion layers which are locate under said second gate electrode.

* * * * *